United States Patent [19]

Osterwalder

[11] 4,092,616
[45] May 30, 1978

[54] TRAVELING WAVE POWER COMBINING APPARATUS

[75] Inventor: Johann Martin Osterwalder, San Diego, Calif.

[73] Assignee: General Dynamics Corporation Electronics Division, San Diego, Calif.

[21] Appl. No.: 743,921

[22] Filed: Nov. 22, 1976

[51] Int. Cl.² .......................... H03F 3/60; H03F 3/68; H03B 0/00; H01P 5/12
[52] U.S. Cl. .......................................... 333/6; 333/9; 330/53; 330/124 R; 331/56
[58] Field of Search ................... 330/124 R, 53, 56; 333/6, 9; 331/56

[56] References Cited
U.S. PATENT DOCUMENTS

| 3,573,651 | 4/1971 | Engelbrecht | 331/56 |
| 3,593,174 | 7/1971 | White | 330/124 R |
| 3,653,046 | 3/1972 | Glance | 331/56 |
| 4,028,632 | 6/1977 | Carter et al. | 330/124 R |

*Primary Examiner*—Alfred E. Smith
*Assistant Examiner*—Harry Barlow
*Attorney, Agent, or Firm*—Brown & Martin

[57] ABSTRACT

A solid state power combining apparatus for use in a microwave transmission system. The apparatus includes a distributed amplifier having an input transmission line, an output transmission line, and a plurality of amplifiers connected between the input and output transmission lines at quarter wavelength intervals. The phase relationship between the traveling waves placed on the output transmission line from the amplifiers is such that the waves placed on the output transmission line by the amplifiers in the direction toward an output terminal add and the waves placed on the output transmission line by adjacent amplifiers in the direction away from the output terminal cancel each other.

Also, a solid state power combining apparatus wherein a plurality of oscillators are connected between input and output transmission lines at quarter wavelength intervals. A phase relationship similar to that of the distributed amplifier apparatus is provided when the oscillators are injection locked in response to an input signal.

13 Claims, 2 Drawing Figures

TRAVELING WAVE POWER COMBINING APPARATUS

BACKGROUND OF THE INVENTION

The present invention generally pertains to solid state microwave communications systems and is particularly directed to power combining apparatus in such systems.

Because the power handling capacity of transistors used in solid state microwave transmitters is limited, it is necessary to provide a power combining apparatus for increasing the power level of the RF signal to be transmitted.

One such power combining apparatus is a distributed amplifier. Such an apparatus includes an input transmission line having an input terminal at one end for connection to a signal source; an output terminal at one end for connection to a load; and a plurality of amplifier stages connected between the input and output transmission lines at regular intervals, with the amplifier that is connected closest to the input terminal being the amplifier that is connected most distant from the output terminal. A signal provided at the input terminal produces a wave that travels along the input transmission line and is amplified by the successive amplifier stages with a progressive phase difference determined by the phase shift for each interval of the transmission lines. The resulting amplified signal produced from each amplifier stage divides, with half flowing on the output transmission line toward the output terminal, and half flowing in the opposite direction.

The use of a power combiner apparatus including a distributing amplifier for increasing the power level of an RF signal in a solid state microwave transmission system was considered by B. Conroy, "Distributed Amplifier Evaluation", JPL Space Programs Summary 37-59, Vol. III, Aug. 1 to Sept. 30, 1969, pp 74-77. Conroy described a distributed amplifier including stripline transmission lines and having the amplifiers connected between the transmission lines at one-half wave length intervals. Conroy concluded that the distributed amplifier was impractical for high-power solid-state microwave transmitters because of (1) direct feedback from each amplifier to all others; and (2) there being no isolation to compensate for imbalances in the power distribution stage gain and power combination.

Power combining apparatus including a distributed amplifier has not been used in high power solid-state microwave transmission systems up until the present invention.

Instead, power combination in such systems has been provided by such complicated devices as N-Way divider/combiners as described by E. J. Wilkinson, "An N-Way Hybrid Power Divider", IRE Trans. on Microwave Theory and Techniques, January 1960, pp 116-118, and U. H. Gysel, "A New N-Way Power Divider/Combiner Suitabble for High-Power Applications", 1975 IEEE MTT-S International Microwave Symposium, May 12-14, 1975, pp 116-118. Moreover, these devices are not only complicated and physically difficult to embody at high frequencies, but the output signal content becomes degraded as the number of amplifier stages is increased.

SUMMARY OF THE INVENTION

The present invention provides a traveling wave power combining apparatus for use in a solid state high-power microwave transmission system for transmitting a signal of a given wavelength, that is characterized by a distributed amplifier including an input transmission line having an input terminal at one end for connection to a signal source; an output transmission line having an output terminal load; and a plurality of amplifiers connected between the input and output transmission lines at quarter wavelength intervals. The phase relationship between the traveling waves placed on the output transmission line from the amplifiers is such that the waves placed on the output transmission line by the amplifiers in the direction toward the output terminal are in phase with each other and thus are added; and that the waves placed on the output transmission line by adjacent amplifiers in the direction away from the output terminal are 180° out of phase with each other and thus cancel each other. An even number of amplifiers is preferred to provide more complete cancellation.

The power combining apparatus of the present invention is not only less complicated and more readily embodied in a practical device at high frequencies than the prior art power combining apparatus, but also provides better performance in regard to non-degradation of the output signal as the number of amplifier stages is increased. The power combining apparatus of the present invention has been successfully tested at L-band frequencies.

In order to improve stability in each amplifier branch, an isolator may be inserted at the output of each amplifier for connecting the amplifier to the output transmission in order to prevent traveling waves on the output lines from being reflected to the amplifiers. This is not essential to the proper operation of the power combining apparatus of the present invention, however, when the characteristics of the amplifier stages are uniformly matched.

Preferably, the input and output transmission lines are microstrip transmission lines. The bandwidth of the power combining apparatus of the present invention should be limited only by the bandwidth of the amplifiers, since the transmission lines are quite broad band. Also, the physical spacing of the amplifier stages can be made extremely dense since the quarter wavelength spacing of the amplifiers can be adjusted by using substrates for the microstrip transmission lines that have a high dielectric constant within wide frequency limits.

The present invention further provides a solid-state power combining apparatus wherein a plurality of oscillator stages are connected between input and output transmission lines at quarter wavelength intervals on the output transmission line to provide a phase relationship when the oscillators are injection locked, wherein the waves placed on the output transmission line by the oscillators in the direction toward the output terminal are in phase with each other and thus are added and the waves placed on the output transmission line by adjacent oscillators in the direction away from the output terminal are 180 degrees out of phase with each other and thus cancel each other. The quarter wave length spacing can be equal to $(m\lambda + \lambda/4)$ wherein $\lambda$ is wavelength and $m = 0, 1, 2 \ldots$, when the size of the oscillator components necessitates that the oscillators be positioned more than a quarter wavelength from each other. This apparatus has been successfully tested at Ku-Band frequencies.

Additional features of the present invention are discussed in relation to the description of the preferred embodiments.

DESCRIPTION OF THE PREFERRED EMBODIMENTS

Figure 1:
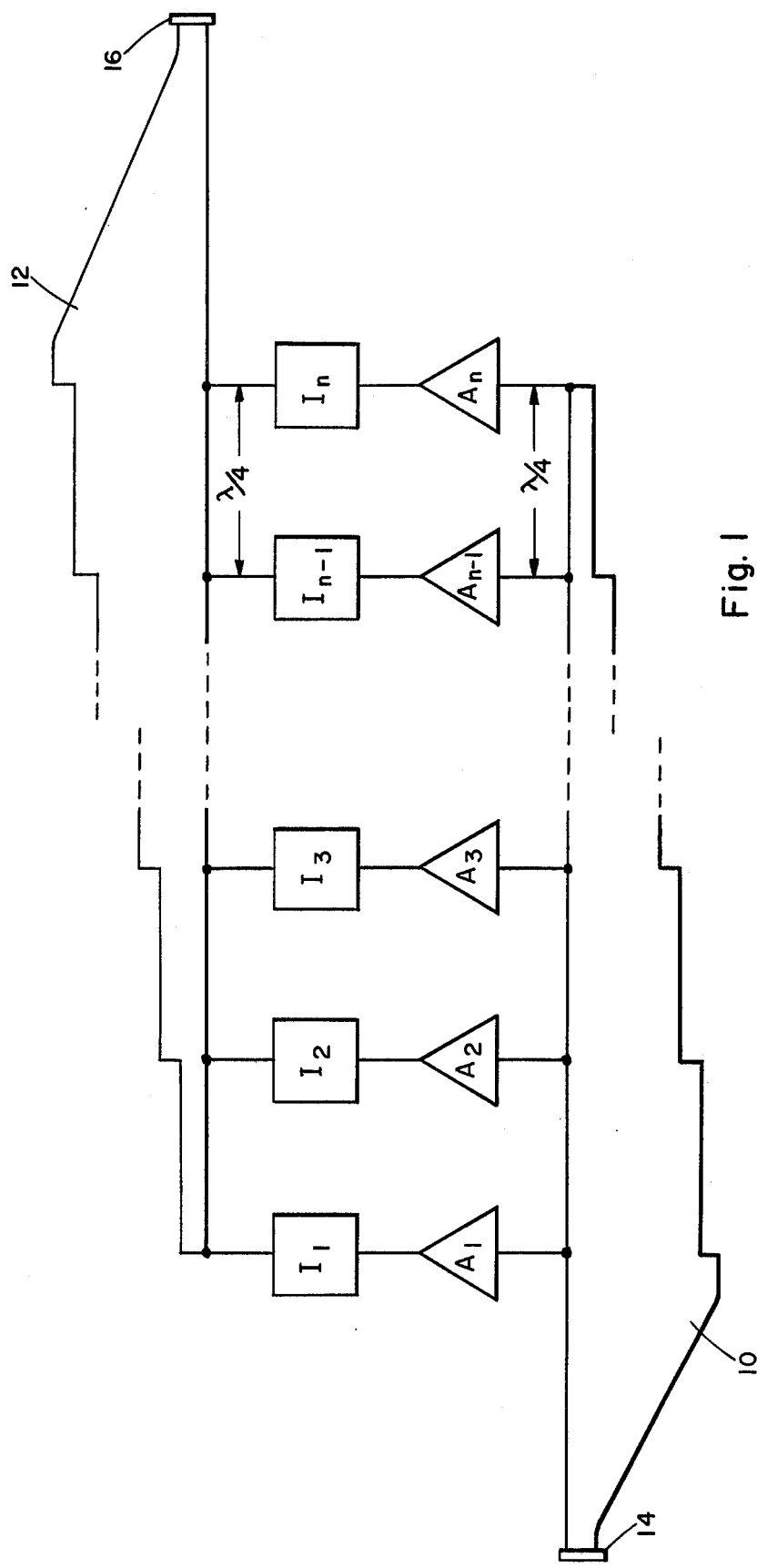
FIG. 1 is a block diagram of a traveling wave power combining apparatus including a distributed amplifier in accordance with the present invention.

Referring to FIG. 1, the traveling wave power combining apparatus including a distributed amplifier includes an input transmission line 10; an output transmission line 12; a plurality of amplifiers $A_1$, $A_2$, $A_3$, ... $A_{N-1}$, and $A_n$; and isolation networks $I_1$, $I_2$, $I_3$, ... $I_{n-1}$ and $I_n$.

The input and output transmission lines 10 and 12 are both of microstrip construction. The input transmission line 10 has an input terminal 14 and the output transmission line 12 has an output terminal 16. The width of the input transmission line decreases in steps at each amplifier feedpoint in the direction away from the input terminal 14; and the width of the output transmission line increases in steps at each amplifier connection in the direction toward the output terminal so as to uniformly impedance match the plurality of amplifiers to the input and output transmission lines. The width of the input transmission line 10 is tapered from the first amplifier $A_1$ to the input terminal 14 and the width of the output transmission line is tapered from the last amplifier $A_n$ to the output terminal 16 so as to impedance match the power combining apparatus to the remainder of the transmission system.

The amplifiers $A_1$, $A_2$, $A_3$, ... $A_{n-1}$ and $A_n$ are connected between the input and output transmission lines 10 and 12 at quarter wavelength intervals $\lambda/4$.

A plurality of isolation networks $I_1$, $I_2$, $I_3$ ... $I_{n-1}$ and $I_n$ are connected between the outputs of the respective amplifiers $A_1$, $A_2$, $A_3$, ... $A_{n-1}$, and $A_n$ and the output transmission line 12 in order to prevent traveling waves on the output transmission line 12 from being reflected to the amplifiers. Without the isolation networks there will be instabilities at higher power levels unless the amplifiers are uniformly matched. Thus the inclusion of the isolation networks allows less precise matching of the amplifiers.

Figure 2:
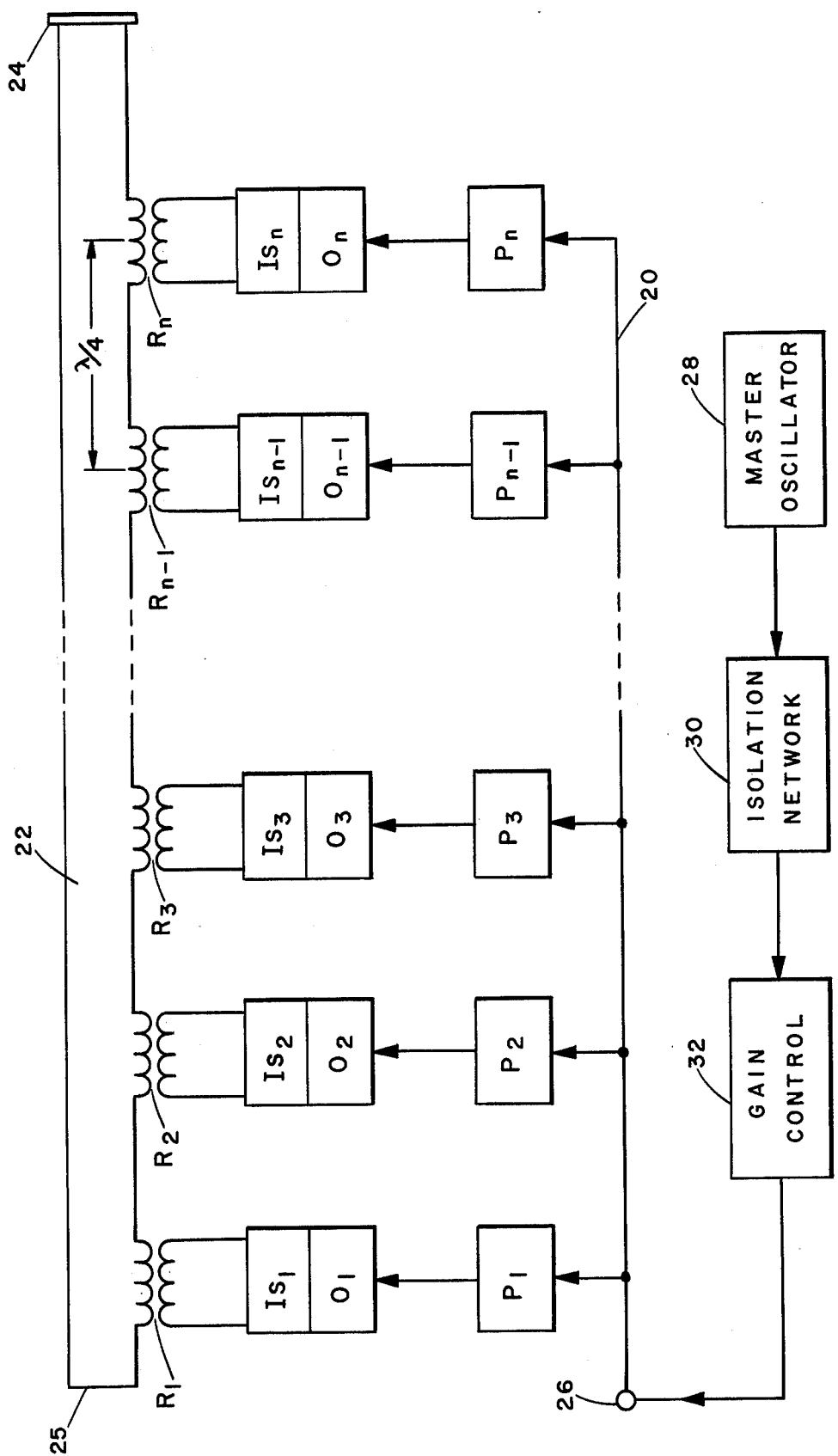
FIG. 2 is a block diagram of a traveling wave power combining apparatus including a plurality of oscillators in accordance with the present invention.

Referring to FIG. 2, the traveling wave power combining apparatus including a traveling wave oscillator, includes an input transmission line 20, an output transmission line 22, a plurality of oscillators $O_1$, $O_2$, $O_3$, ... $O_{n-1}$, and $O_n$, a plurality of isolation networks $Is_1$, $Is_2$, $Is_3$, ... $Is_{n-1}$, and $Is_n$; and a plurality of phase shifting networks $P_1$, $P_2$, $P_3$, ... $P_{n-1}$, and $P_n$.

The output transmission line 22 is a waveguide having an output terminal 24. The opposite end 25 of the waveguide 22 is short circuited. The input transmission line 20 has an input terminal 26. The input transmission line 20 also is a waveguide. The waveguide 22 includes a plurality of openings (which are represented schematically by an inductive coupling symbol) $R_1$, $R_2$, $R_3$, ... $R_{n-1}$, and $R_n$ which are spaced apart at quarter wavelength intervals (center to center spacing). Each of these openings are covered by a thin iris sheet, (not shown) which can be adjusted and locked into place to control the coupling to the output of the particular oscillator stage coupled to the respective opening.

The isolation networks $Is_1$, $Is_2$, $Is_3$, ... $Is_{n-1}$, and $Ts_n$ are connected between the outputs of the respective oscillators and the output transmission line 22 in order to prevent traveling waves on the output transmission line from being reflected to the oscillators.

The phase shifting networks $P_1$, $P_2$, $P_3$, ... $P_{n-1}$, and $P_n$ are connected between the oscillators and the input transmission line 20. Because the variable iris coupling between the waveguide and each oscillator stage introduces some phase shift, the phase shifting networks are necessary for providing the desired phase relationship between the traveling waves placed on the output transmission line from the oscillators when the oscillators are injection locked in response to a signal received at the input terminal 26.

An injection locking input signal is provided at the input signal 26 by a master oscillator 28 via an isolation network 30 and a gain control network 32.

The input and output transmission lines 20 and 22 may be of microstrip construction instead of waveguides. However, the phase shifting networks are still preferred with the microstrip transmission lines, because of difficulties in providing uniform coupling to the transmission lines at high frequencies without introducing some additional phase shift.

I claim:

1. A solid state traveling wave power combining apparatus for use in a microwave transmission system for transmitting a signal of a given wave-length comprising a distributed amplifier characterized by:

an input transmission line having an input terminal at one end for connection to a signal source;

an output transmission line having an output terminal at one end for connection to a load; and a plurality of amplifiers connected between the input and output transmission lines at quarter wavelength intervals with the amplifier that is connected closest to the input terminal being the amplifier that is connected most distant from the output terminal, thereby providing a phase relationship between the traveling waves placed on the output transmission line from the amplifiers such that the waves placed on the output transmission line by the amplifiers in the direction toward the output terminal are in phase with each other and thus are added, and that the waves placed on the output transmission line by adjacent amplifiers in the direction away from the output terminal are 180° out of phase with each other and thus cancel each other.

2. A solid state traveling wave power combining apparatus according to claim 1, further comprising a plurality of isolating means, with one of each isolating means being connected between a said amplifier output and the output transmission line for preventing traveling waves on the output transmission line from being reflected to the amplifiers.

3. A solid state traveling wave power combining apparatus according to claim 1, wherein the transmission lines are microstrip transmission lines.

4. A solid state traveling wave power combining apparatus according to claim 3, wherein the width of the input microstrip transmission line decreases in steps at each amplifier connection in the direction away from the input terminal, and the width of the output microstrip transmission line increases in steps at each amplifier connection in the direction toward the output terminal so as to uniformly impedance match the plurality of amplifiers to the input and output transmission lines.

5. A solid state traveling wave power combining apparatus for transmitting a signal of a given wavelength, comprising:
   an input transmission line having an input terminal at one end for connection to a signal source;
   an output waveguide transmission line having an output terminal at one end for connection to a load and a plurality of openings each of which is covered by an iris sheet;
   a plurality of oscillators connected between the input transmission lines and the openings in the waveguide at quarter wavelength intervals with the oscillator that is connected closest to the input terminal being the oscillator that is connected most distant from the output terminal; and
   a plurality of phase shifting means with one of each of phase shifting means being connected between a said oscillator and the input transmission line for providing a phase relationship between the traveling waves placed on the output transmission line from the oscillators when the oscillators are injection locked in response to a signal received at the input terminal such that the waves placed on the output transmission line by amplifiers in the direction toward the output terminal are in phase with each other and thus are added, and that the waves placed on the output transmission line by adjacent amplifiers in the direction away from the output terminal are 180° out of phase with each other and thus cancel each other.

6. A solid state traveling wave power combining apparatus according to claim 5, further comprising a master oscillator circuit for providing said injection locking input signal.

7. A solid state traveling wave power combining apparatus according to claim 6, further comprising;
   a plurality of isolating means, with one of each isolating means being connected between a said oscillator output and the waveguide for preventing traveling waves on the output transmission line from being reflected to the oscillators.

8. A solid state traveling wave power combining apparatus according to claim 5, further comprising:
   a plurality of isolating means, with one of each isolating means being connected between a said oscillator output and the waveguide for preventing traveling waves on the output transmission line from being reflected to the oscillators.

9. A solid state traveling wave power combining apparatus system for transmitting a signal of a given wavelength, comprising:
   an input transmission line having an input terminal at one end for connection to a signal source;
   an output transmission line having an output terminal at one end for connection to a load; and
   a plurality of oscillators connected between the input and output transmission lines at quarter wavelength intervals on the output transmission line with the oscillator that is connected closest to the input terminal being the oscillator that is connected most distant from the output terminal, thereby providing a phase relationship between the traveling waves placed on the output transmission line from the oscillators when the oscillators are injected locked in response to a signal received at the input terminal such that the waves placed on the output transmission line by the oscillators in the direction toward the output terminal are in phase with each other and thus are added, and that the waves placed on the output transmission line by adjacent oscillators in the direction away from the output terminal are 180° out of phase with each other and thus cancel each other.

10. A solid state traveling wave power combining apparatus according to claim 9, further comprising:
    a plurality of phase shifting means with one of each of phase shifting means being connected between a said oscillator and the input transmission line for providing a phase relationship between the traveling waves placed on the output transmission line from the oscillators when the oscillators are injection locked in response to a signal received at the input terminal such that the waves placed on the output transmission line by the amplifiers in the direction toward the output terminal are in phase with each other and thus are added, and that the waves placed on the output transmission line by adjacent amplifiers in the direction away from the output terminal are 180° out of phase with each other and thus cancel each other.

11. A solid state traveling wave power combining apparatus according to claim 9, further comprising a master oscillator circuit for providing said injection locking input signal.

12. A solid state traveling wave power combining apparatus according to claim 11, further comprising:
    a plurality of isolating means, with one of each isolating means being connected between a said oscillator output and the output transmission line for preventing traveling waves on the output transmission line from being reflected to the oscillators.

13. A solid state traveling wave power combining apparatus according to claim 9, further comprising:
    a plurality of isolating means, with one of each isolating means being connected between a said oscillator output and the output transmission line for preventing traveling waves on the output transmission line from being reflected to the oscillators.

* * * * *